(12) United States Patent
Petersen

(10) Patent No.: US 6,800,401 B2
(45) Date of Patent: Oct. 5, 2004

(54) METHOD FOR PHASE SHIFT MASK DESIGN, FABRICATION, AND USE

(75) Inventor: John S. Petersen, Austin, TX (US)

(73) Assignee: Petersen Advanced Lithography, Inc., Austin, TX (US)

(*) Notice: Subject to any disclaimer, the term of this patent is extended or adjusted under 35 U.S.C. 154(b) by 0 days.

(21) Appl. No.: 09/843,622

(22) Filed: Apr. 26, 2001

(65) Prior Publication Data

US 2002/0015900 A1 Feb. 7, 2002

Related U.S. Application Data

(60) Provisional application No. 60/200,113, filed on Apr. 27, 2000.

(51) Int. Cl.⁷ .................................................. G03F 9/00
(52) U.S. Cl. ............................. 430/5; 430/22; 430/30; 716/19; 716/20; 716/21
(58) Field of Search ................................ 430/5, 22, 30, 430/11; 716/19–21

(56) References Cited

U.S. PATENT DOCUMENTS

| | | | |
|---|---|---|---|
| 4,737,448 A | | 4/1988 | Hochberg .................... 430/321 |
| 5,229,230 A | | 7/1993 | Kamon ........................... 430/5 |
| 5,274,420 A | | 12/1993 | Chastang et al. ............. 355/67 |
| 5,316,896 A | * | 5/1994 | Fukuda et al. ............... 430/322 |
| 5,424,154 A | | 6/1995 | Borodovsky ................... 430/5 |
| 5,482,801 A | | 1/1996 | Smith et al. .................... 430/5 |
| 5,660,956 A | | 8/1997 | Tomofuji et al. ............... 430/5 |
| 5,715,039 A | | 2/1998 | Fukuda et al. ................ 355/53 |
| 5,837,169 A | | 11/1998 | Rourke ....................... 264/1.27 |
| 5,955,222 A | | 9/1999 | Hibbs et al. .................... 430/5 |
| 5,958,630 A | | 9/1999 | Hashimoto et al. ............ 430/5 |
| 5,959,325 A | | 9/1999 | Adair et al. ................. 257/302 |
| 6,004,699 A | * | 12/1999 | Yasuzato et al. ............... 430/5 |
| 6,014,422 A | | 1/2000 | Boyd et al. .................. 378/34 |
| 6,142,641 A | | 11/2000 | Cohen et al. ............... 359/859 |
| 6,177,980 B1 | | 1/2001 | Johnson ....................... 355/67 |
| 6,184,151 B1 | | 2/2001 | Adair et al. ................. 438/743 |
| 6,320,648 B1 | * | 11/2001 | Brueck et al. ................ 355/67 |
| 6,401,236 B1 | * | 6/2002 | Baggenstoss et al. ......... 716/19 |
| 6,411,642 B1 | * | 6/2002 | Mazed ....................... 372/103 |

OTHER PUBLICATIONS

"Optics for Photolithography" B.W.Smith in □□Microlithography; eds: J.R.Sheats, B.W.Smith, Marcel Dekker,(1998), NY, pp. 171–270.*

* cited by examiner

*Primary Examiner*—Mark F. Huff
*Assistant Examiner*—Kripa Sagar
(74) *Attorney, Agent, or Firm*—Hamilton, Brook, Smith & Reynolds, P.C.

(57) ABSTRACT

A system and method of strong phase-shifting a beam from an actinic light source in a lithographic process includes focusing a beam from the electromagnetic beam source onto a mask adapted to selectively phase-shift at least a portion of the beam according to a predetermined pattern. The beam is passed from the actinic light source through the mask producing a phase-shifted beam, and the phase-shifted beam is directed at a substrate such as a semiconductor wafer adapted to be selectively etched according to the predetermined pattern. The strong phase-shift serves to substantially eliminate zero-order light in the phase-shifted beam. Strong phase-shift mask techniques, through a two electromagnetic beam interference imaging process, are known in the art of microlithography to form imaging results for features of a size well below the limit of conventional prior art imaging.

36 Claims, 7 Drawing Sheets

METHOD FOR PHASE SHIFT MASK DESIGN, FABRICATION, AND USE

RELATED APPLICATION(S)

This application claims the benefit of U.S. Provisional Application No. 60/200,113, filed on Apr. 27, 2000, the entire teachings of which are incorporated herein by reference.

NOTICE OF COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

Lithographic processes are known for semiconductor fabrication which employ an actinic light source focused through a mask onto a substrate, or resist, through a lens. The mask has a predetermined pattern which selectively passes the actinic light source to produce a desired image on the resist. However, the light is subject to interference, such as diffraction, as it passes from the mask to the resist surface. The diffraction pattern contains all the information about the predetermined pattern but passes through a lens of finite size and some of the information contained within the diffraction pattern is filtered out. Accordingly, the image on the resist can become slightly distorted from the predetermined image on the mask. In semiconductor fabrication, however, it is desirable to minimize such distortion to enable a smaller minimum feature size on the substrate. Since the minimum feature size defines the density of the electronic elements on the substrate, a smaller minimum feature size allows more elements to be placed per unit area on the substrate or for the same density to make a electronic element faster.

FIG. 1 shows a prior art conventional and phase-shift mask for use in a lithographic process. Referring to the mask cross-sectional views in FIG. 1, a conventional mask 2 has opaque chrome 8 or other light blocking regions, which define a predetermined pattern to be formed. Actinic light 6 is directed at the mask 2 to form an image on a wafer (not shown) or other substrate according to the predetermined pattern. A phase-shift mask 4 further includes a shifter layer 9 according to the predetermined pattern. The shifter layer 9 shifts the phase of the actinic light 6 180 degrees to produce the light amplitude shown in graph 3. The light amplitude results in a light amplitude distribution shown in graph 5, which results in the light intensity distribution shown in graph 7.

Phase-shift masks may be employed to reduce the distortion caused from loss in information due to diffraction by creating destructive interference on the resist plane between the light of opposite phases. However, the actinic light 6 source generates an electric field between light beams of different phases of zero magnitude and elimination of zero-frequency light, or zero-order light, between the beams of different phases by balancing the opposing electric fields reduces phase error between the diffracted beams and allows a smaller minimum feature size.

It would be beneficial, therefore, to provide a system and method for providing a photolithographic phase-shift mask which balances the energy between electric fields of opposed phase to substantially reduce or eliminate zero-frequency energy to produce a strong phase-shifted, dual beam to reduce diffraction and reduce the minimum feature size on a substrate to which the dual beam is directed.

SUMMARY OF THE INVENTION

A system and method of strong phase-shifting a beam from an actinic light source in a lithographic process includes focusing a beam from an electromagnetic beam source onto a mask adapted to selectively phase-shift at least a portion of the beam according to a predetermined pattern. The beam is passed from the actinic light source through the mask producing a phase-shifted beam, and the phase-shifted beam is directed at a substrate such as a semiconductor wafer adapted to be selectively etched according to the predetermined pattern. The strong phase-shift serves to substantially eliminate zero-order light in the phase-shifted beam. Strong phase-shift mask techniques, through a two electromagnetic beam interference imaging process, are known in the art of microlithography to form imaging results for an isolated primary feature of a size well below the limit of conventional prior art imaging.

The use of sub-resolution assist features in the field of microlithography is known to provide optical proximity compensation, reduce the mask error enhancement factor (MEEF), minimize the effect of aberrations and boost isolated line performance with off-axis illumination. Assist features such as scattering bars are opaque or semitransparent features that are offset from primary features in the bright field and anti-scattering bars are their dark field analogues. They were first used as an optical proximity correction technique; or, if phase-shifted, as a weak phase-shift mask technique. Later, it was shown that they could reduce MEEF and aberrations. Finally, they have been shown to boost the performance of isolated line features using off-axis illumination. The invention as defined by the present claims is based on the use of phase-shifted assist features to improve the imaging capability of an isolated, or primary feature by balancing the opposing electric fields of the primary and assist features to minimize or eliminate the electric field at the zero frequency of the primary features. In the art, when the electric field is eliminated at zero frequency, the imaging is said to be strong phase-shifted and the image is constructed using a two-beam imaging technique. Two-beam imaging is better than conventional imaging because it restricts interference angles needed to reconstruct the image in a way where their phase relationship is maintained to improve resistance to change in focus and exposure, as well as, to provide improved performance in the presence of other aberrations. Most phase-shifting techniques used for imaging isolated features are not strong. This is because properly balanced features would be large enough to print an unwanted pattern in the resist, and as a result, the microlithography community did not actively pursue this technique.

The invention as defined by the present claims provides a method to design and fabricate a strong phase-shift mask for use in the imaging of a photoresist material during the fabrication of semiconductor devices. This invention is not limited only to the fabrication of semiconductors, but also extends to the manufacture of other elements that use the microlithography imaging technique. The method has special application to isolated or semi-isolated clear field features placed on a dark background. The method works by determining the layout and fabrication requirements of a photomask such that as actinic energy is passed through the mask forming a diffraction pattern, the electric fields that form of opposite phase are equal, and thus balanced in strength with respect to their average integrated amplitudes. By balancing the energy between electric fields of opposing phase, this method eliminates zero-frequency energy and makes a strong phase-shifted, two-beam imaging system. Thus, it works much in the fashion of a strong phase-shift mask but is not limited to the normal methods of making a strong phase-shift mask and can use most any phase-shifter technique that is known in the imaging arts. The invention provides a method for layout and fabrication of a strong phase-shift feature that takes into account the final size of the feature, the ability of a photoresist not to image assist features, the capability of the projection printer, and the phase-shift mask's topographical modification of the electric field.

The method as disclosed herein is not limited to making isolated or semi-isolated clear features on a dark background, but alternatively can be used for other feature density as long as the electric field between regions of opposing phase can be balanced to give the desired result. Examples of using this type of imaging technique would be the fabrication of discrete semiconductor devices such as is common, but not restricted to gallium-arsenic technology and to CMOS microprocessor gates. The invention also claims that the technique for making a strong phase-shift mask can be used to make a weak phase-shift mask. A weak phase-shift mask is a mask that has some electric field strength at the zero frequency of the diffraction pattern. This field at the zero frequency allows the image to be formed using a technique that requires a zero frequency component to form the image. An example of this would be the formation of a small square aperture using an exposure tool with off-axis illumination.

The isolated feature can be strong phase-shifted by making the strength of the electrics fields of a primary feature and that of the sum of assist features equal but of opposite phase. The desired phase-shift can be made by an additive or subtractive etch process of the assist features or the primary feature, and may employ using a material of transmittance greater than 0 and less than or equal to one for the assist features. Large assist features improve image quality and the ability to fabricate said features, and may be employed by reducing the transmission of assist features by a subtractive process, and may employ a material with transmission greater than zero but less than 1.0, whereby an effective phase-shift of 180 degrees is maintained, but the trench depth is an odd multiple of the thickness required to attain the 180 degree phase and the multiple is greater than one. Mask fabrication specification and design methodology may employ an EMF simulator to find the complex transmittance and phase of a given design scheme that provides the strong phase-shifter result. Further, the fabrication may be applied to multiple pairs of assist features and to two dimensional primary features, and may also be employed in the case of a dark phase-shifted surrounded on two or more sides such that the electric fields are to be balanced between the two regions of opposing phase, and in the case where the overall field intensity needs to be increased so that the feature is easier to print amongst the plurality of other features found on the same mask.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Recent advances in resist chemistry and resist processing prevents the resist from imaging the assist features within the critical sizing regime of the primary feature. The invention as defined by the present claims utilizes this resist capability to not print the assist features and tuning the complex transmittance of the phase-shift features on the mask to produce a strong phase-shift mask for imaging the primary feature using a strong phase-shifting technique. In a particular embodiment, several techniques and combinations thereof adjust the complex transmittance of the features, and is based on producing the highest fidelity and most robust image in the photoresist while maintaining design rules so that the photomask can be manufactured in a reliable fashion. An alternate embodiment uses the same techniques to produce an image that is optimal for use with off-axis illumination of the photomask by the exposure tool. The diffraction patterned formed by this mask has a component of nonzero magnitude electric field at zero frequency and is said to be weak phase-shifted.

Phase-shift mask fabrication techniques in conjunction with the invention as defined by the present claims include Petersen, *Analytical Description of Anti-scattering and Scattering Bar Assist Features*, Optical Microlithography XIII, Volume 4000, © 2000, Society of Photo-Optical Instrumentation Engineers; Gerold et al., *Multiple Pitch Transmission and Phase Analysis of Six Types of Strong Phase-Shifting Masks*, Petersen Advanced Lithography, Inc., Austin, Tex. 78579, http://www.advlitho.com: and Gordon et al., *Design and Analysis of Manufacturable Alternating Phase-Shifting Masks*, 18th Annual BACUS Symposium on Photomask Technology and Management, Volume 3546, © 1998, Society of Photo-Optical Instrumentation Engineers; all co-authored by the applicant of the present application and incorporated herein by reference in their entirety.

Figure 1:
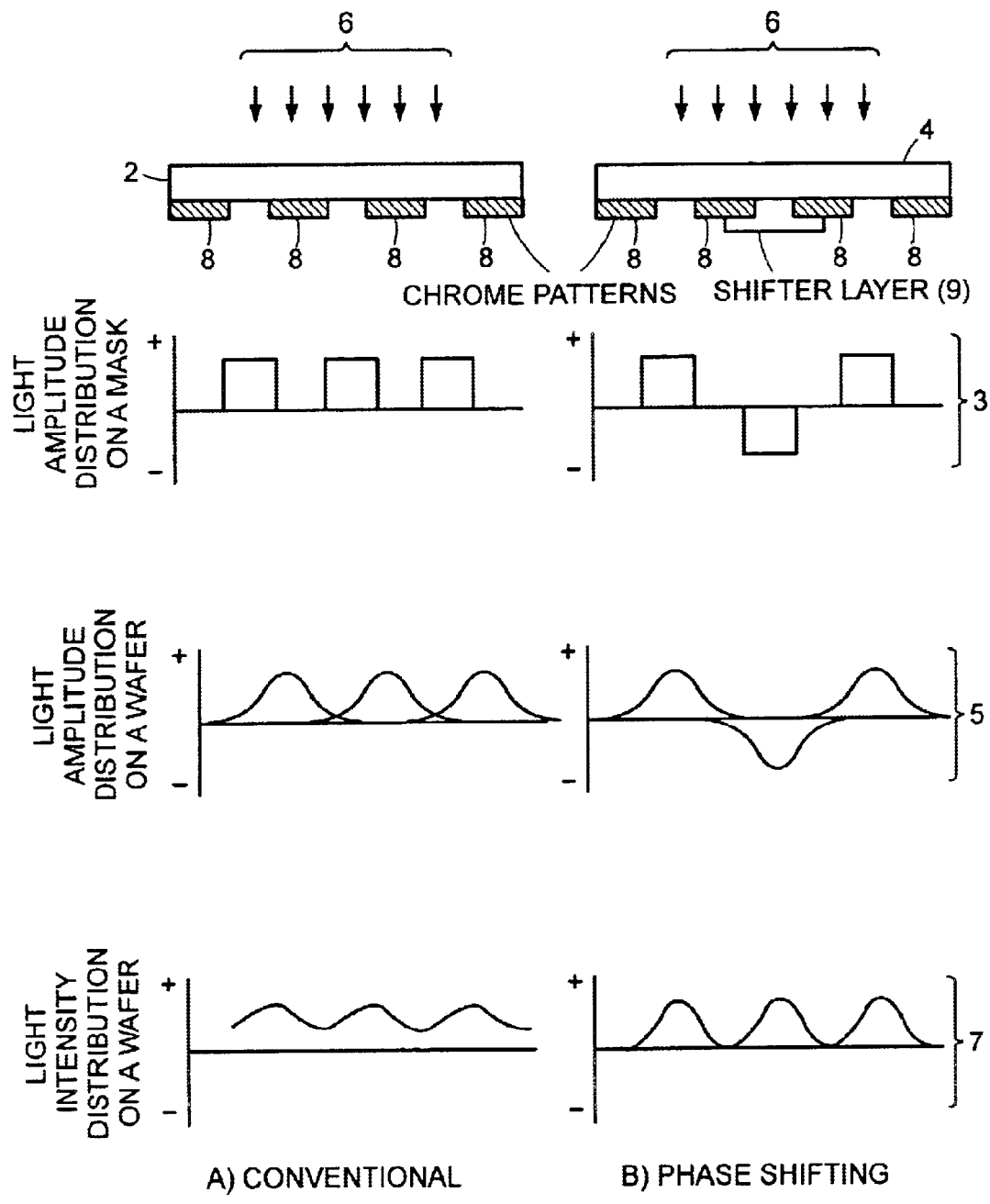
FIG. 1 shows a prior art phase-shift mask.
Figure 2:
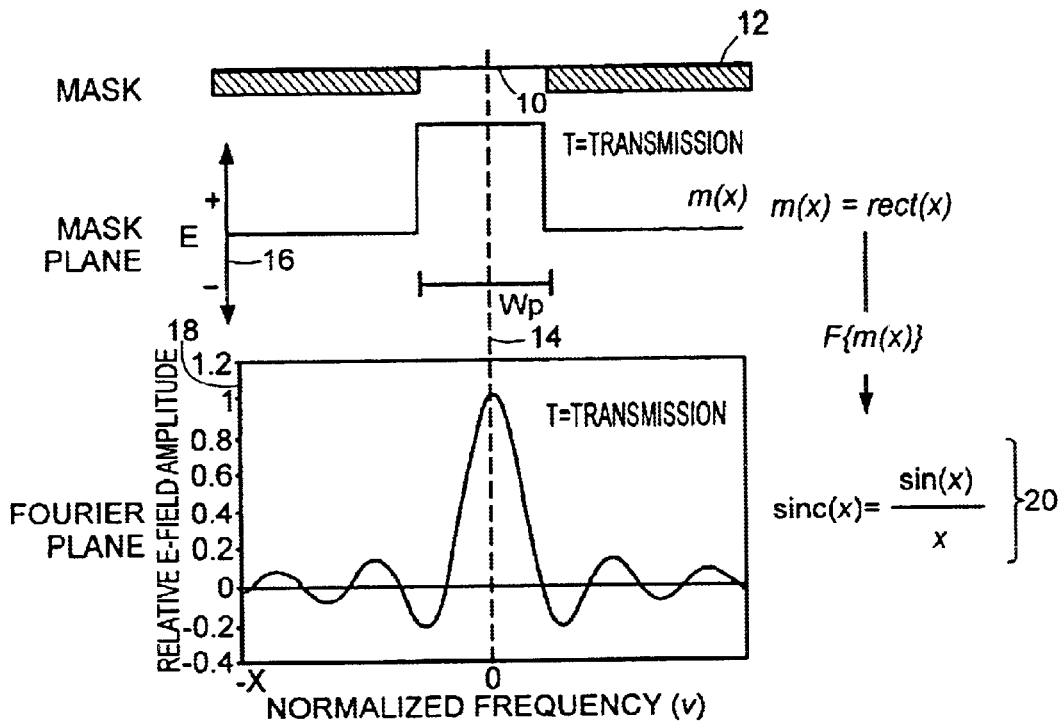
FIG. 2 shows a cross section of a mask with an isolated space defining an isolated primary feature.

FIG. 2 shows a cross sectional view of an isolated primary feature on a photomask. Referring to FIG. 2, an isolated primary feature 10 defined on a photomask 12 of width, $w_P$, centered about x–0, shown by dotted line 14. The shape of the electric field that is formed when coherent energy is passed through the slot is shown at the mask plane 16 and at the pupil or Fourier plane 18. At the mask plane 16 the electric field can be described as a rect function of the horizontal distance, x. Rect(x) is zero every where except in the region between the edges of the space where it is not zero and there, is proportional to the complex transparency of the mask. In the pupil plane 18 of the lens, the isolated feature has a diffraction pattern that is described by the Fourier transform M(v) or F{m(x)} of rect(x) which is sin(x)/x and is called sinc(x) 20. The Fourier analysis transforms x-dimensional space to frequency space, v. The Fourier transform is shown in Equation 1.

$$M(v) = F\{m(x)\} = \int_{-\infty}^{+\infty} m(x)e^{-i2\pi vx}dx \quad \text{Equation 1}$$

In this work, frequency is normalized to the range −nNA/λ to +nNA/λ, where n is a factor that typically ranges from one to ten, NA is the numerical aperture of the pupil and λ is the actinic wavelength incident on the mask. Unless otherwise stated herein, the solutions are based on coherent imaging. However, to see what might affect the image formation at the wafer, it is useful to set n=1+σ, where σ is the partial coherence of the imaging system. In this way, only the range that can be accepted by NA is observed. The sinc function is everywhere in phase and can interfere to form the final image using any or all of the available interference angles contained within the sinc function envelope.

Figure 3:
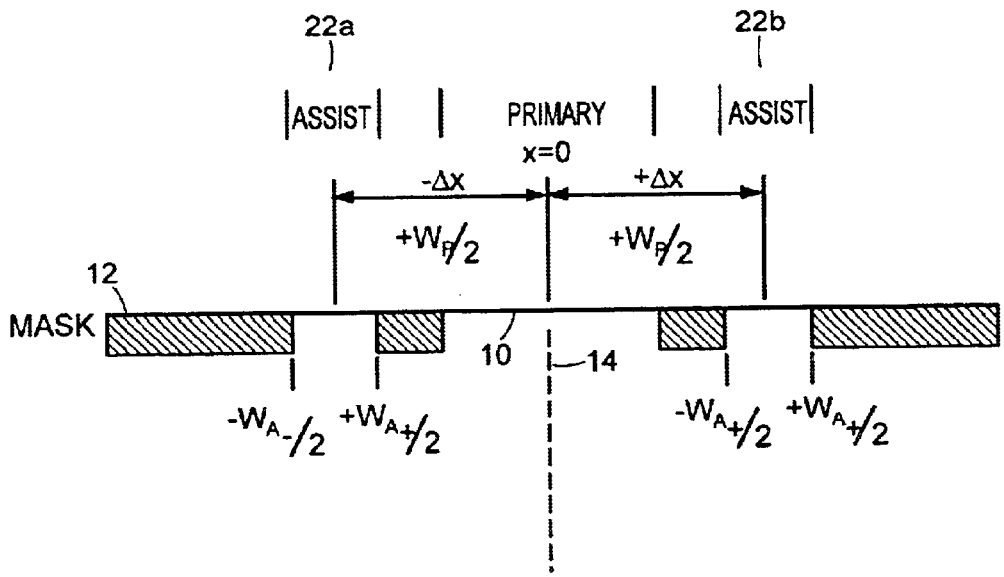
FIG. 3 shows an isolated space with assist features.

FIG. 3 shows the isolated space 10 with assist features 22a, 22b added symmetrically about x=0, shown by dotted line 14. In this figure the width of the left and right assist features, 22a, 22b, $w_L$ and $w_R$, respectively, are equal in size and transmittance. Like the primary features, the assist features can be described by their own sinc functions. They however are placed equidistant from the center of the primary feature by Δx.

To derive the analytic solution for the assisted feature use superposition to solve $M(v)_{Total}$ by setting it equal to the sum of the individual transforms of $M(v)_{Primary}$, $M(v)_{Left}$ and $M(v)_{Right}$; where the assists are phase-shifted relative to each other proportional to Δx, as defined by the shift theorem of Fourier analysis. Mathematically, this sum is Equation 2.

$$M(v) = F\{m(x)\} = F\{P(x)\} + F\{A_{Left}(x+\Delta x)\} + F\{A_{Right}(x-\Delta x)\} \quad \text{Equation 2}$$

where v is frequency.

For the primary feature 10, centered at x=0, with width $w_P$ and complex transmittance $T_P$, Equation 3:

$$F\{P(x)\} = \int_{-w_P/2}^{+w_P/2} P(x)e^{-i2\pi vx}dx \quad \text{Equation 3}$$

$$= T_P \frac{\sin(\pi v w_P)}{\pi v}$$

multiply $\frac{w_P}{w_P}$ to get sinc(πx) to yield:

$$F\{P(x)\} = T_P w_P \, \text{sinc}(\pi v w_P)$$

Now apply the shift theorem to the assist features 22a and 22b, centered at x=−Δx and +Δx, Equation 4a and 4b:

$$F\{A_{Left}(x+\Delta x)\} = T_{A_L} w_{A_L} e^{+i2\pi v \Delta x} \, \text{sinc}(\pi v w_{A_L}) \quad \text{Equation 4a}$$

$$F\{A_{Right}(x-\Delta x)\} = T_{A_R} w_{A_R} e^{-i2\pi v \Delta x} \, \text{sinc}(\pi v w_{A_R}) \quad \text{Equation 4b}$$

Then using superposition add all three spaces for a binary mask. If the assist features are asymmetric in $w_A$, $T_A$, or Δx, the solution is complex as shown in Equation 5:

$$F\{m(x)\} = F\{P(x)\} + F\{A_{Right}(x-\Delta x)\} + F\{A_{Left}(x+\Delta x)\}$$

if assists features are different $= T_P w_P$ $$\text{sinc}(\pi v w_P) + T_{A_L} w_{A_L}$$

$$e^{+i2\pi v \Delta x} \, \text{sinc}(\pi v w_{A_L}) +$$

$$T_{A_R} w_{A_R} e^{-i2\pi v \Delta x}$$

$$\text{sinc}(\pi v w_{A_R}) \quad \text{Equation 5}$$

If the assist features are not asymmetric the solution is shown in Equation 6:

$$F\{m(x)\} = T_P w_P \, \text{sinc}(\pi v w_P) + T_A w_A \, \text{sinc}(\pi v w_A)(e^{-i2\pi v \Delta x} + e^{+i2\pi v \Delta x}) \quad \text{Equation 6}$$

Using Euler's equation, Equation 6 is simplified to Equation 7:

$$= T_P w_P \, \text{sinc}(\pi v w_P) + 2 T_A w_A \cos(2\pi v \Delta x) \text{sinc}(\pi v w_A) \quad \text{Equation 7}$$

Phase-shifting can be examined simply by subtracting either the primary, Equation 8, or of the combined assist feature term, Equation 9.

$$F\{m(x)\} = -T_P w_P \, \text{sinc}(\pi v w_P) + 2 T_A w_A \cos(2\pi v \Delta x) \text{sinc}(\pi v w_A) \quad \text{Equation 8}$$

or $$= T_P w_P \, \text{sinc}(\pi v w_P) - 2 T_A w_A \cos(2\pi v \Delta x) \text{sinc}(\pi v w_A) \quad \text{Equation 9}$$

Figure 4:
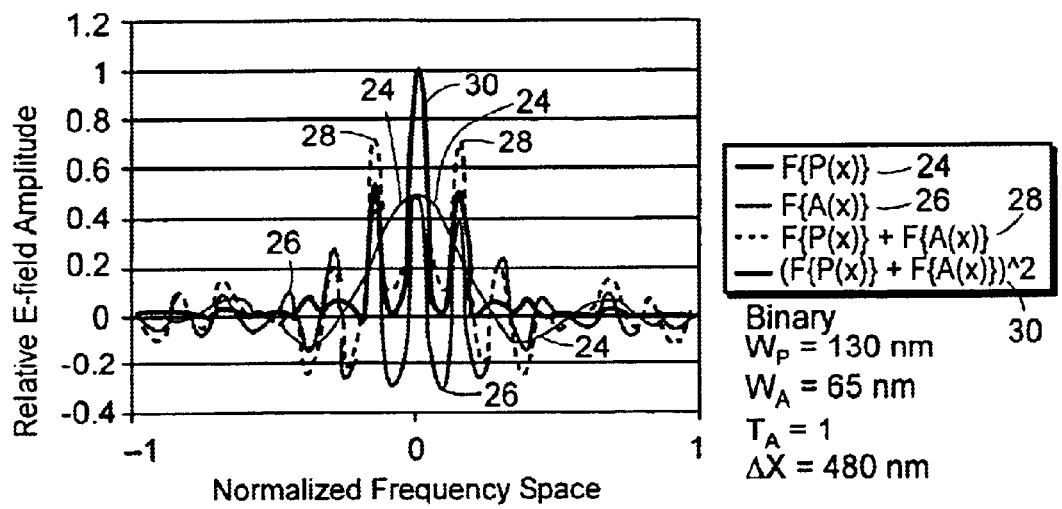
FIG. 4 shows a graphical representation of a phase-shift.
Figure 5:
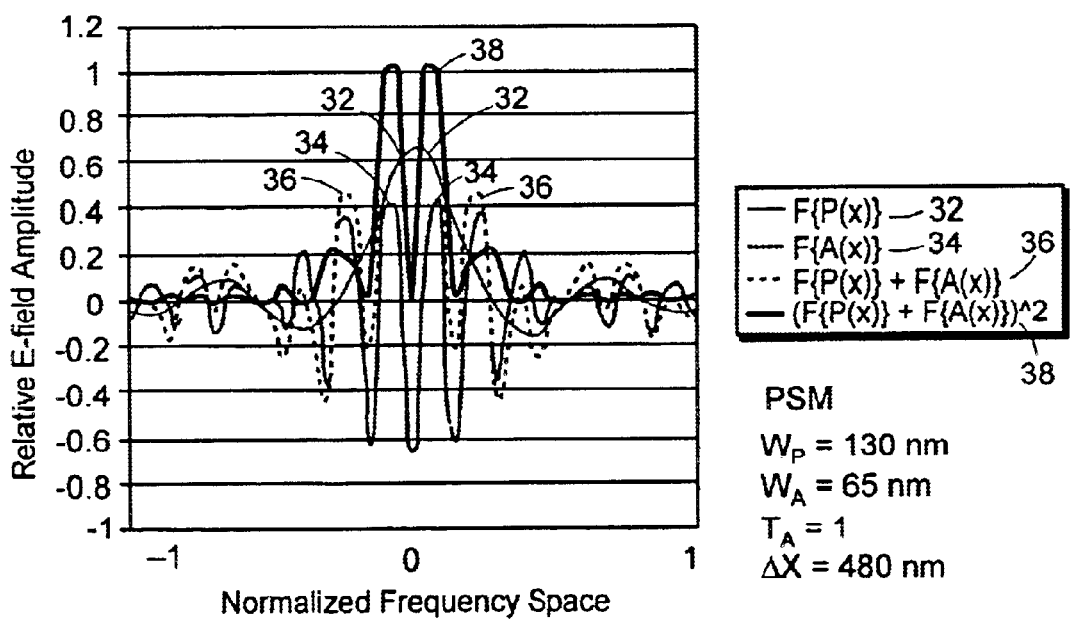
FIG. 5 shows a graphical representation of a strong phase-shift.

FIG. 4 shows a graphical representation of the binary solution for Equation 7, and FIG. 5 shows a phase-shift solution for Equation 9. Referring to FIG. 4, a plot of relative electric field amplitude and the square of the amplitude versus relative frequency is shown for n=10 for an 130 mm isolated space with 65 nm assists and complex transmittance of one. The amplitude is relative to the maximum amplitude of the primary, $F\{m(x)\}^2=(F\{P(x)\}+F\{A(x)\})^2$. The curves are: the primary sinc, F{P(x)} 24, the cosine of the combined assist features that are shaped by the assist feature sinc F{A(x)} 26, the sum of the Fourier transforms, F{P(x)}+F{A(x)} 28, and the square of that sum (F{P(x)}+F{A(x)})^2 30. FIG. 5 shows a strong phase-shift result using similar parameters, thereby reducing or eliminating zero-frequency light including the primary sinc, F{P(x)} 32, the cosine of the combined assist features that are shaped by the assist feature sinc F{A(x)} 34, the sum of the Fourier transforms, F{P(x)}+F{A(x)} 36, and the square of that sum (F{P(x)}+F{A(x)})^2 38.

FIGS. 4 and 5 both disclose dark field solutions. To convert them to bright field simply subtract the dark field solution from a delta function, Equation 10.

$$F\{m(x)\}_{Bright\text{-}field} = \delta(v) - F\{m(x)\}_{Dark\text{-}field} \quad \text{Equation 10}$$

The examination of the analytic solutions will be restricted to the dark field cases in Equations 7, 8 and 9.

An understanding of the diffraction pattern that forms when the features all have the same phase relationship on the mask may prove beneficial in light of the invention disclosed herein. That is, the features have not been modified by introducing a phase relationship to either the primary or the assist feature that arises from using a material of selected transmittance that also has a 180 degree phase difference from the other features.

For binary masks, the dark field solution is shown by its components in FIG. 4. This is a plot of relative electric field amplitude and the square of the amplitude versus relative frequency, for n=10 for a 130 nm isolated space with 65 nm assists and complex transmittance of one. The amplitude is relative to the maximum amplitude of the primary, $F\{m(x)\}^2=(F\{P(x)\}+F\{A(x)\})^2$. FIG. 4 has four curves, the primary sinc 24, the cosine of the combined assist features that are shaped by the assist feature sinc 26, the sum of the all Fourier transforms 28 and the square of that sum 30. Note that all sinc functions have a maximum at zero frequency and that the sum of all the transforms is a function that has side-lobes symmetrically placed around a strong central-lobe centered at zero frequency. While this function looks somewhat like the diffraction pattern of discrete orders formed by an infinite series of lines and spaces it is not discrete, it is still a sinc, albeit modified. This means that even if the modified sinc function matches the frequency and amplitude of a diffraction pattern of a dense line, it still contains the information of the isolated feature 10 (FIG. 5) and will print as such.

Although this is true, the space does print differently, and when used properly, it prints better. First, with proper tuning of all the lobes the feature can be made to print the same size as the dense feature, thus its use as an OPC structure. Second, image printability improves because the trimming of the primary sinc reduces the set of non-optimal angles that interfere to form the image at the image plane of the wafer. In the bright field, this improvement gives rise to an increase in depth of focus, and the reduction of MEEF. For the same reason, modifying the sinc reduces sensitivity to aberrations by decreasing the effects of aberrated beams with non-optimal interference angles.

Finally, it improves the performance of off-axis illumination, not only by reducing non-optimal interference but also by maximizing the interference that does occur by setting the frequency to match the frequency of the dense line diffraction pattern that the illuminator was designed to enhance. These attributes make scattering and anti-scattering bars important image process integration tools for extending production resolution.

For phase-shift masks, the dark field solution is shown by its components in FIG. 5. This is a plot of relative electric field amplitude and the square of the amplitude versus relative frequency, for n=10 for a 130 nm isolated space with 65 nm assists and complex transmittance of one. The amplitude is relative to the maximum amplitude of the primary, $F\{m(x)\}^2-(F\{P(x)\}+F\{A(x)\})^2$. FIG. 5 has four curves, the primary sinc 32, the cosine of the combined assist features that are shaped by the assist feature sinc 34, the sum of the all Fourier transforms 36 and the square of that sum 38. The sum of all the transforms is a function that has side-lobes symmetrically placed around zero frequency with amplitude that is generally less than its binary mask analog. As shown in FIG. 5, in this design, the electric field of the assists can be manipulated to be equal but opposite of the primary, thus zeroing the amplitude of the central lobe. Under these conditions, the modified sinc function matches the frequency and amplitude of a strong phase-shifted feature.

At first glance this diffraction patterns looks like the discrete diffraction pattern of a infinite series of lines and spaces whose zero order has been removed by an opaque aperture in the pupil plane of the lens. This type of imaging is known as dark field. If this was really dark field imaging only the edges of the feature would be resolved and we would not know if this image was a series of small spaces and large lines or the other way around. However, this is not the discrete diffraction pattern of a series of lines and spaces but a modified sinc diffraction pattern of an isolated line described by Equation 9. For that reason, it still contains information about being an isolated space and produces the corresponding photoresist image.

Strong phase-shift formation of the image does so by interfering the two lobes of the modified sinc function when they are brought back together at the image plane. Because the lobes are symmetric about the center of the optical axis the beams maintain a uniform interference relationship when equally aberrated, as in the case where the imaging material is moved in or out of the best image plane. This movement from the image plane is called changing the focus setting from optimum or best focus. This invariance in the interference relationship with focus gives rise to better stability of the size and shape of the final resist image. In fact, with respect to spatial coherence, if the lobes were points with no radial distribution about their nodal centers, the depth of focus would be infinite. However, since the nodes are not points and energy distribution exists away from the nodal center, the interference from these off center components reduce the focus tolerance to something less than infinite, but one that is still significantly better than the depth of focus of an unmodified sinc function or of a modified function whose phase-shifted electric fields are not perfectly balanced. The nodal center frequency is also important. This is because there are some complex phase relationships about the center of each node that are best trimmed out using the numerical aperture of the lens as a low frequency filter to get the best performance.

Figure 6:
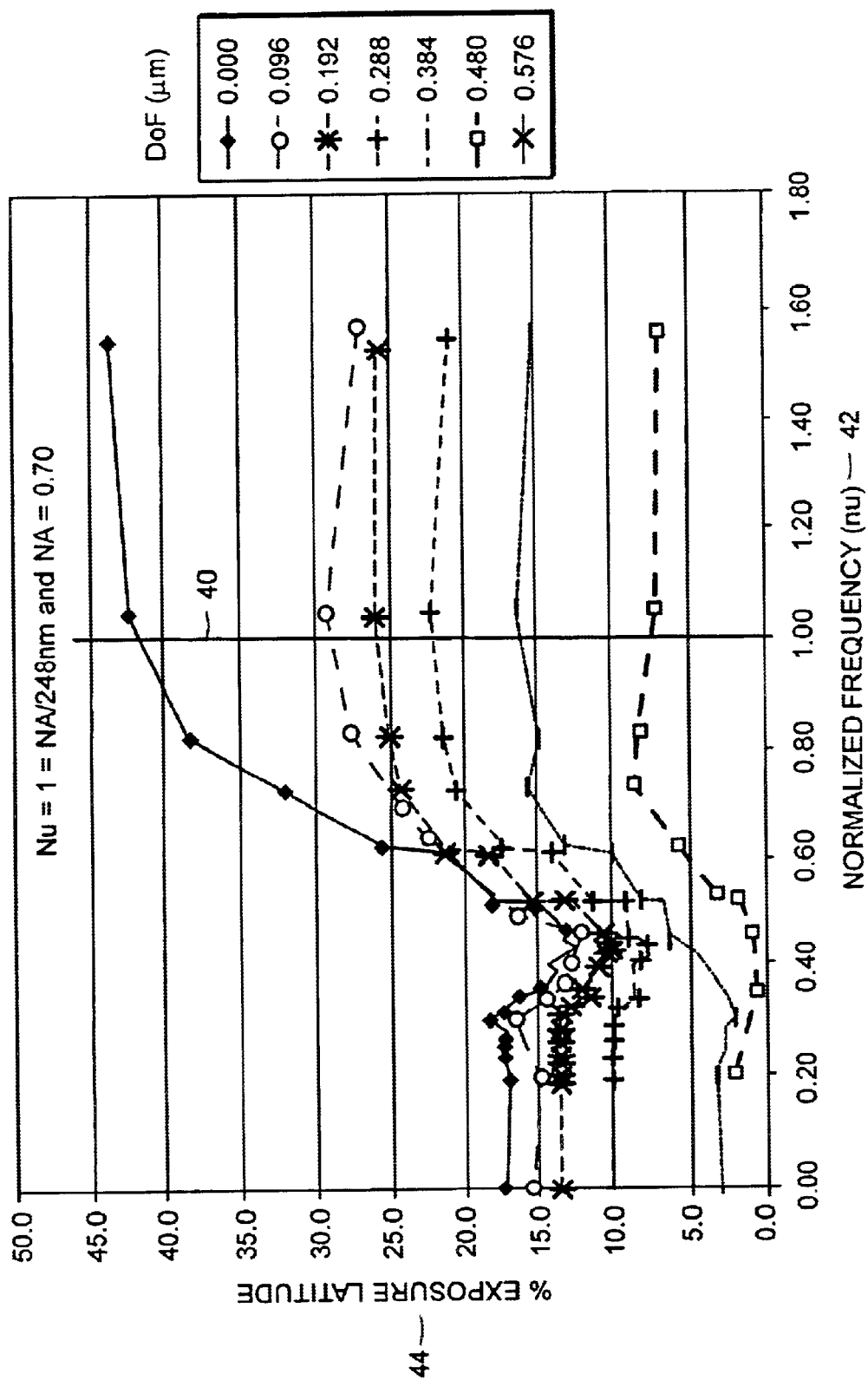
FIG. 6 shows percent exposure latitude for different amounts of depth of focus (DoF) from 0.000 microns to 0.576 microns.

The frequency where the center of each node is located is driven by the distance $\Delta x$. The smaller this value, the greater the absolute frequency value. FIG. 6 shows how the focus tolerance changes with nodal position in frequency space. Referring to FIG. 6, the vertical axis 40 shows the percent exposure range about the dose to size a 130 nm clear isolated feature with respect to frequency for varying amounts of defocus. Typically, for an exposure tool with 0.70 numerical aperture 248 nm exposure wavelength and partial coherence of 0.3, a process is said to be production worthy if the exposure latitude, shown by axis 44 is greater than or equal to 5% and has a focus tolerance of more than 0.4 microns. In FIG. 6, this occurs when the normalized frequency is larger than 0.6, with optimum performance at frequencies between 0.8 and 1.2. Below the frequency of 0.6, shown by axis 42, from 0 to 0.3 the performance is the same as an unmodified sinc function and the phase-shifter provides no enhancement. Between frequencies 42 of 0.3 and 0.6, the performance is worse than if no phase-shifting was used. This degradation appears to be related to the introduction of 180-degree phase component of the node and the width of this phase region defined by the partial coherence of the imaging system. This phase component is not observed at frequencies 42 greater than 0.92 for coherent light, but with partially coherent illumination it would be first introduced at 0.92 minus the coherence, 0.3 in this example for a value of 0.62. This means that not only does zero frequency need to be reduced to zero for the best imaging to occur but that the phase-shifted assist feature must be placed properly to remove any unwanted phase component.

The invention as defined by the present claims provides a phase-shift mask design for optimizing the imaging performance of a discrete isolated space. In this invention the sum of the complex transmittance and the width for the assist features is fabricated to cancel the electric field of the primary feature so that the amplitude at zero frequency is zero within the manufacturing tolerances of the fabrication process used to make the phase-shift mask. Equation 11 shows that for the simple case of one pair of assist features this occurs when:

$$T_P \cdot w_P = 2 \cdot T_A \cdot w_A \qquad \text{Equation 11}$$

Further, the assist features are placed close enough to the primary feature to place the side-lobes of the Fourier transform at frequencies greater than 0.6 and less than or equal to a frequency that is equal to Equation 12:

$$v \le \frac{(1 + \alpha \cdot \sigma) \cdot \Delta x \cdot NA}{\lambda} \qquad \text{Equation 12}$$

Where σ and NA equal the partial coherence and numerical aperture of the exposure tool, respectively, and α is a factor bigger than one that takes into account that the side-lobe has a width that is defined by the variables in Equations 8 and 9. Multiple pairs of assist features can be used, as long as the sum of the Fourier transform of all features still yields zero amplitude at zero frequency within manufacturing tolerances.

Figure 7:
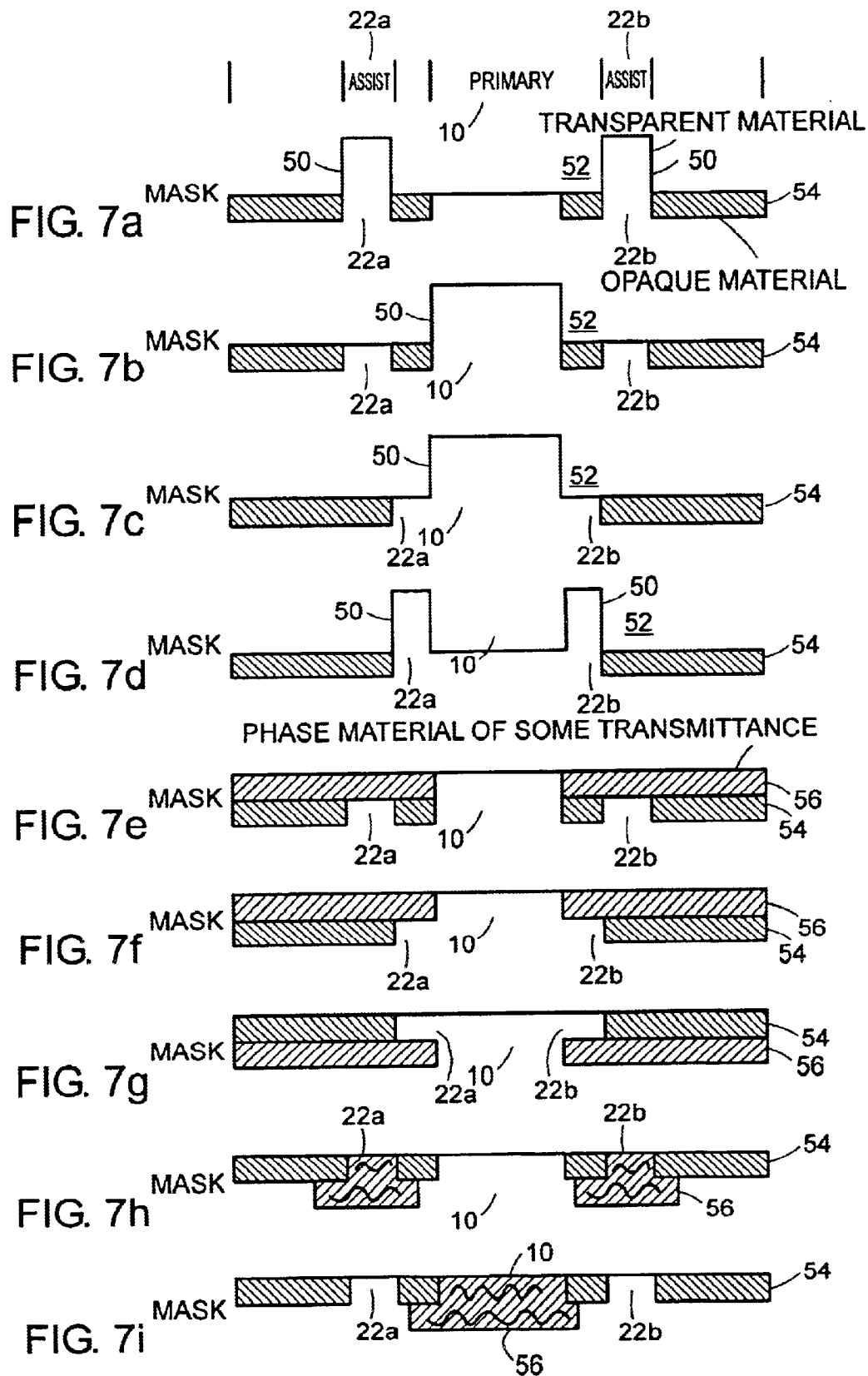
FIGS. 7a–7i show a variety of embodiments including various combinations of primary and assist features.

FIGS. 7a–7i show different embodiments of the invention for a primary feature with a single pair of assist features. FIG. 7a shows a trench 50 cut into a transparent material 52 such as glass or chrome to define the assist features 22a and 22b. The layer beneath the transparent material 52 is an opaque material 54 also cut according to the predetermined pattern defining the assist features 22a and 22b. FIG. 7b shows the trench 50 cut into the primary feature 10. FIG. 7c shows the embodiment of FIG. 7b with the assist features 22a, 22b positioned adjacent to the primary feature 10. FIG. 7d shows an embodiment similar to FIG. 7a with the assist features 22a, 22b adjacent to the primary feature 10. FIG. 7e shows an attenuated phase-shift material 56 that has an opaque layer 54 beneath it to define the assist features 22a, 22b. FIG. 7f shows a similar embodiment as FIG. 7e where the assist features 22a, 22b are adjacent to the primary feature 10. FIG. 7g shows the attenuated phase-shift material 56 beneath the opaque layer 54. FIG. 7h shows an alternative embodiment in which the opaque layer 54 forms all the features then a layer of the appropriate phase and transmission is deposited on top of the film and the selectively removed from the primary feature 10. FIG. 7i shows a similar embodiment as FIG. 7h wherein the material is removed from the assist features 22a, 22b rather than the primary.

Note that the foregoing embodiments illustrated in FIGS. 7a–7i represent varying complexity in the required fabrication techniques, and the particular fabrication technique chosen depends on the availability of fabrication resources and does not deviate from the scope of the invention as defined by the present claims. Referring to Equations 8 and 9 and to FIGS. 7a–7i, when the assist feature is separated from the primary feature (FIGS. 7a, 7b, 7e, 7h), the preferred embodiment is Equation 9 where the assist features are used to make the relative phase-shift with the primary feature (FIGS. 7a, 7e and 7h). This is because cutting trenches or using attenuated phase-shift material, reduces the complex transmittance of the modified feature, making it possible to increase the size of $w_A$. Since the assist features are the smaller than the primary feature, making it bigger makes it easier to fabricate because the width of the assists and the primary begin to approach each other. Secondly, since the width of the sinc function is equal to $1/w_A$, bigger features will decrease the width of the side-lobe that forms in Equation 9.

Figure 8:
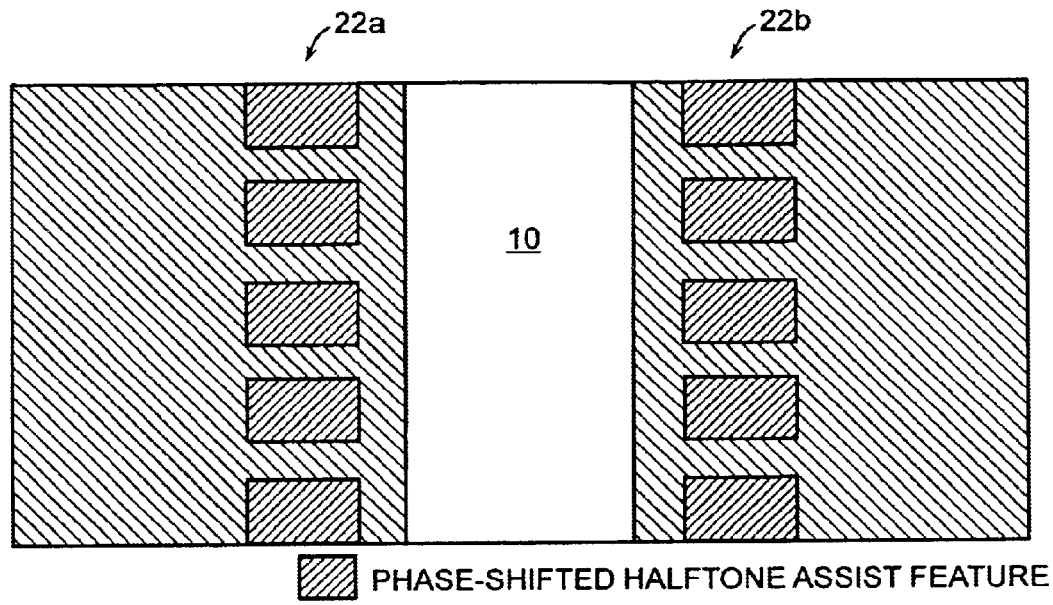
FIG. 8 shows a top-down view of an isolated primary feature with phase-shifted halftone assist features.
Figure 9A:
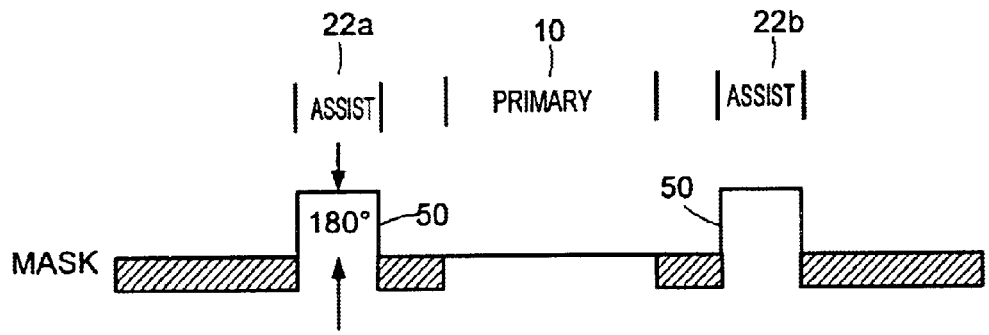
FIGS. 9a and 9b show cross-sections of an isolated feature with the trenches of the phase-shift assist features.
Figure 9B:
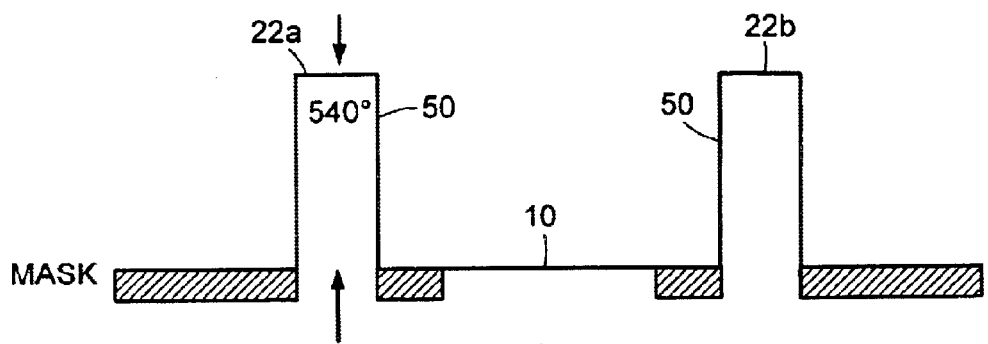

FIG. 8 shows a top-down view of an isolated primary feature 10 with phase-shifted halftone assist features 22a, 22b of the embodiments of FIGS. 7a–7i. FIGS. 9a and 9b show cross-sections of an isolated feature 10 with the trenches of the phase-shift assist features 22a, 22b. FIG. 9a shows a trench 50' which represents a 180 degree phase-shift. FIG. 9b shows a trench 50" which represents a 540 degree phase-shift, and is three times deeper than the trench 50'. Deeper trenches provide assist features 22a, 22b which are less transmissive, thereby allowing a larger width and facilitating fabrication.

Figure 10:
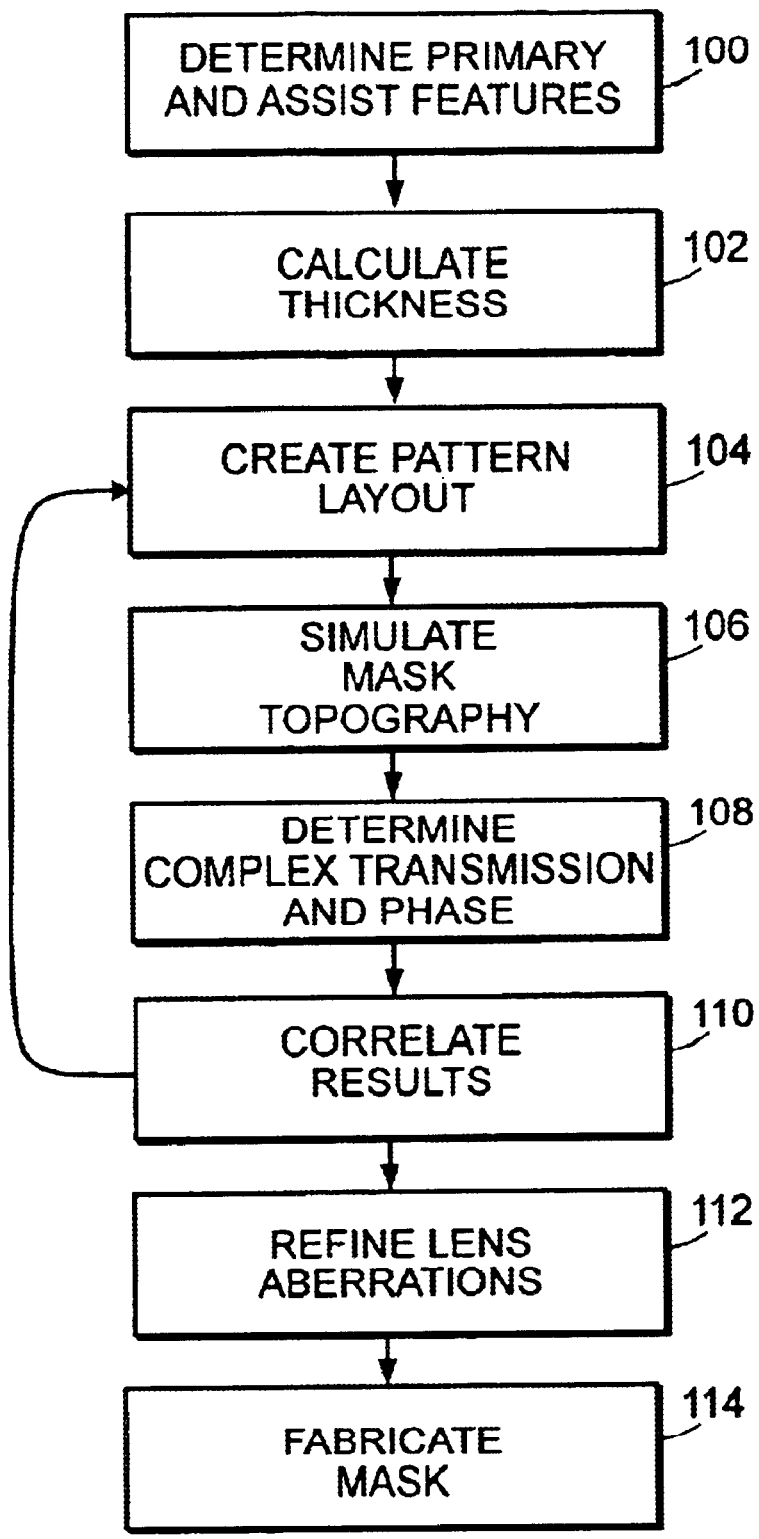
FIG. 10 shows a flowchart of strong phase-shift mask fabrication as defined by the present claims.

FIG. 10 shows a flowchart of strong phase-shift mask fabrication as defined by the present claims. Referring to FIG. 10, to determine the proper electric field balance between the primary and the assist features, the invention uses the following method. An optical lithography simulator such as PROLITH (available commercially from FINLE Technologies, Austin, Tex.) is employed to determine the best layout for the primary and assist features for the imaging conditions, as shown at step 100. Consider all the variables in Equations 8, 9, 11 (remember the transmittance equals the square of the complex transmittance) and 12 plus photoresist and exposure tool performance, substrate conditions and requirements for pattern transfer, and the mask fabrication capability.

The depth of trench or thickness of material needed to produce an odd multiple of a 180-degree phase-shift is calculated, as depicted at step 102. The multiple is typically one but can be any odd number as long as the fabrication process is capable of producing it in a final product. To this end, making the trench in the subtractive process as deep as possible will reduce the complex transmittance making it possible to make $w_A$ larger.

A pattern layout based on equations 11 and 12 is created, as disclosed at step 104. For a trench into the material underlying the opaque layer such is common in the art, like, but not limited to quartz, or for a non-absorbing deposited material, assume 100% transmittance. Thus $T_P = T_A = 1.0$ and $w_A = 0.5 w_P$. If using an attenuated phase-shift material use Equation 11 to determine the first $w_A$ to try.

A simulation of the effect of the mask topography is performed using an electromagnetic simulator designed for such purposes, like, but not limited to, TEMPEST (UC Berkeley, Berkeley, Calif., and more recently from Panoramic Technology, Berkeley, Calif.) and ProMax (FINLE Technologies, a division of KLA-Tencor, Austin, Tex.), as shown at step 106.

The mask topography of step 106 is employed to determine the complex transmission and phase of the phase-modified features, as disclosed at step 108. This can be done a number of ways, but one method is to generate a grayscale mask of phase and complex transmission relative to the horizontal position on the mask, and input this mask into a lithography simulator. Then determine the aerial image produced through the desired imaging tool for varying degrees of focus and also its diffraction pattern.

The complex transmission and phase are invoked to adjust the mask and correlate the results, as shown at step 110. Control reverts to step 104 until the desired diffraction pattern of zero energy at zero frequency is attained. If adjustments in the vertical direction, z, do not yield an optimum condition, then additional assist features of same phase, but of smaller size, by 1/n where n equals the number of assists, or of alternating phase can be added, but if alternating phase structures are used the last set of assists should mach the phase of the assists nearest the primary feature to maintain zero electric field at zero frequency. Referring again to FIG. 8, alternatively or in combination with the multiple features, the assist features 22a and 22b can use subresolution halftoning of the assists to make them have lower transmittance as shown by 22a and 22b. In this case the size and pitch must be small enough to diffract all of the halftone information outside of the lens leaving only zero diffraction order energy so that the individual components of the halftone features do not print, while maintaining the requirement that these features too can be manufactured.

As a final refinement, the actual lens and illuminator aberrations are refined so that the mask design can account for them, as shown at step 112. Control then reverts to step 104 until a refinement threshold of zero-frequency energy is attained.

The mask may then be fabricated, as shown at step 114, employing the information from above to design the mask and its fabrication requirements. Fabrication of the phase-shift mask involves employing metrology to determine if structural requirements are met to within the capabilities of the fabrication process. Exposure of the mask and tuning of the exposure tool, resist and pattern transfer processes are performed to achieve optimal results. Compare to expected results and fine-tune the layout and fabrication process to further improve the results. The fabrication of the mask may be performed iteratively as required to account for lack of metrology accuracy and/or mask fabrication biases such as differences between test structure phase-trench depths.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of phase-shifting a beam from an electromagnetic beam source in a lithographic process comprising:

focusing a beam from the electromagnetic beam source onto a mask having a primary feature and one or more assist features proximate to the primary feature, the one or more assist features configured such that, when an electromagnetic beam passes through the mask, opposing electric fields generated at the primary feature and at the one or more assist features balance to substantially eliminate the electric field at the zero frequency at the primary feature, the mask adapted to selectively phase-shift at least a portion of the beam according to a predetermined pattern;

passing the beam from the electromagnetic beam source through the mask producing a phase-shifted beam having substantially no zero-order light; and directing the phase-shifted beam at a substrate adapted to image the primary feature.

2. The method of claim 1 wherein the phase-shifted beam comprises a plurality of beam portions.

3. The method of claim 2 wherein the beam portions include at least a first beam portion and a second beam portion.

4. The method of claim 3 wherein the first beam portion corresponds to at least one primary feature and the second beam portion corresponds to at least one assist feature.

5. The method of claim 3 wherein the first beam portion and the second beam portion are at unequal phases.

6. The method of claim 5 wherein the first beam portion is substantially a multiple of 180 degrees out of phase from the second beam portion.

7. The method of claim 1 wherein the phase-shift is a strong phase-shift.

8. The method of claim 4 wherein the primary feature is an isolated feature on the mask.

9. The method of claim 4 further comprising forming the assist feature by a subtractive etch process.

10. The method of claim 4 further comprising forming the primary feature by a subtractive etch process.

11. The method of claim 1 further comprising forming the mask from a photomask material having a transmittance greater than zero and less than or equal to one.

12. The method of claim 4 further comprising forming the assist feature by an additive process.

13. The method of claim 4 further comprising forming the primary feature by an additive process.

14. The method of claim 1 wherein the electromagnetic beam source is an actinic light source.

15. The method of claim 1 further comprising the steps of:
    employing an EMF (electromagnetic field) simulator; and
    determining a complex transmittance and phase.

16. The method of claim 4 wherein the at least one assist feature comprises multiple pairs of assist features.

17. The method of claim 4 wherein the at least one primary feature comprises two dimensional primary features.

18. A method of forming a phase-shift mask employing photomask topography and photoresist sensitivity to electromagnetic radiation comprising:

determining a proposed pattern layout for a phase-shift mask comprising a primary feature and one or more assist features;

analyzing, in a frequency domain, the phase and amplitude of a diffraction pattern of the proposed mask pattern via a Fourier transform; and based upon the analysis step, adjusting a physical characteristic of the primary feature or an assist feature, and repeating the analyzing and adjusting steps until a final mask pattern is determined in which opposing electric fields generated at the primary feature and at the one or more assist features balance to substantially eliminate the electric field at the zero frequency of the primary feature, thereby improving tolerance to imaging system focal variation during a final image formation.

19. The method of claim 18, further comprising fabricating a mask in accordance with the final mask pattern layout.

20. A method of forming a phase-shift mask employing photomask topography and photoresist sensitivity to electromagnetic radiation comprising:

determining a proposed pattern layout for a phase-shift mask comprising a primary feature and one or more assist features;

analyzing, in a frequency domain, the phase and amplitude of a diffraction pattern of the proposed mask pattern via a Fourier transform; and based upon the analysis step, adjusting a physical characteristic of the primary feature or an assist feature, and repeating the analyzing and adjusting steps until a final mask pattern is determined in which opposing electric fields generated at the primary feature and at the one or more assist features balance to produce a desired amount of zero-order light for a selected imaging application, wherein the phase-shift mask comprises a strong phase-shift mask.

21. A method of forming a phase-shift mask employing photomask topography and photoresist sensitivity to electromagnetic radiation comprising:

determining a proposed pattern layout for a phase-shift mask comprising a primary feature and one or more assist features;

analyzing, in a frequency domain, the phase and amplitude of a diffraction pattern of the proposed mask pattern via a Fourier transform; and based upon the analysis step, adjusting a physical characteristic of the primary feature or an assist feature, and repeating the analyzing and adjusting steps until a final mask pattern is determined in which opposing electric fields generated at the primary feature and at the one or more assist features balance to produce a desired amount of zero-order light for a selected imaging application, wherein the mask pattern is designed to substantially eliminate zero-order light when an electromagnetic beam passes through the primary feature and the one or more assist features.

22. The method of claim 18, wherein the desired imaging application comprises imaging an isolated feature.

23. A method of forming a phase-shift mask employing photomask topography and photoresist sensitivity to electromagnetic radiation comprising:

determining a proposed pattern layout for a phase-shift mask comprising a primary feature and one or more assist features;

analyzing, in a frequency domain, the phase and amplitude of a diffraction pattern of the proposed mask pattern via a Fourier transform; and based upon the analysis step, adjusting a physical characteristic of the primary feature or an assist feature, and repeating the analyzing and adjusting steps until a final mask pattern is determined in which opposing electric fields generated at the primary feature and at the one or more assist features balance to produce a desired amount of zero-order light for a selected imaging application, wherein the desired imaging application comprises an off-axis illumination.

24. The method of claim 18, wherein the analyzing step comprises simulating the performance of the proposed mask layout on a computer.

25. The method of claim 24 wherein the computer further comprises a plurality of computers in parallel.

26. The method of claim 18, wherein adjusting a physical characteristic of the primary feature or an assist feature comprises adjusting at least one of the size, location, thickness, or transmittance of the feature.

27. The method of claim 18 further comprising forming an assist feature by a subtractive etch process.

28. The method of claim 18 further comprising forming the primary feature by a subtractive etch process.

29. The method of claim 18 further comprising forming an assist feature by an additive process.

30. The method of claim 18 further comprising forming the primary feature by an additive process.

31. The method of claim 18 further comprising forming the mask from a photomask material having a transmittance greater than zero and less than or equal to one.

32. The method of claim 18 further comprising forming an assist feature from a material having a transmittance greater than zero and less than or equal to one.

33. The method of claim 18 wherein the analyzing step comprises:

employing an EMF (electromagnetic field) simulator; and determining a complex transmittance and phase of the primary and assist features, and using this information to construct a diffraction pattern for analysis.

34. The method of claim 18 wherein the one or more assist features comprises multiple pairs of assist features.

35. The method of claim 18 wherein the primary feature comprises a two dimensional primary feature.

36. The method of claim 23, wherein the method is used with off-axis illumination to substantially eliminate a symmetric sources of interference from diffraction beams of higher order (greater than zero) and/or zero order, thereby improving tolerance to imaging system focal variation during a final image formation.

* * * * *